United States Patent [19]
Muller et al.

[11] Patent Number: 6,124,141
[45] Date of Patent: Sep. 26, 2000

[54] NON-DESTRUCTIVE METHOD AND DEVICE FOR MEASURING THE DEPTH OF A BURIED INTERFACE

[75] Inventors: K. Paul Muller, Wappingers Falls; Venkatachalam C. Jaiprakash, Beacon, both of N.Y.

[73] Assignees: International Business Machines Corporation, Armonk, N.Y.; Infineon Technologies North America Corp., San Jose, Calif.

[21] Appl. No.: 09/004,074

[22] Filed: Jan. 7, 1998

[51] Int. Cl.[7] .................................................. G01R 31/26
[52] U.S. Cl. .......................... 438/14; 438/243; 438/386
[58] Field of Search ............................. 438/14, 16, 390, 438/392, 243, 386, 246, 247

[56] References Cited

U.S. PATENT DOCUMENTS

| | | |
|---|---|---|
| 4,975,581 | 12/1990 | Robinson et al. ............... 250/339 |
| 5,023,188 | 6/1991 | Tanaka ............................... 438/8 |
| 5,087,121 | 2/1992 | Kakuchi et al. ................. 356/73 |
| 5,229,304 | 7/1993 | Chang et al. ...................... 438/7 |
| 5,392,118 | 2/1995 | Wickramasinghe ............. 356/355 |
| 5,618,751 | 4/1997 | Golden et al. ................. 438/392 |
| 5,627,092 | 5/1997 | Alsmeier et al. .............. 438/152 |

OTHER PUBLICATIONS

FT–IR Spectrometers, FTS 175 and FTS 185, Bio–Rad Laboratories.

*Primary Examiner*—Carl Whitehead, Jr.
*Assistant Examiner*—Jeff Vockrodt
*Attorney, Agent, or Firm*—Pollock, Vande Sande & Amernick

[57] ABSTRACT

The depth at which the top surface of a buried interface is located is non-destructively determined by FTIR.

6 Claims, 5 Drawing Sheets

NON-DESTRUCTIVE METHOD AND DEVICE FOR MEASURING THE DEPTH OF A BURIED INTERFACE

TECHNICAL FIELD

The present invention is concerned with a non-destructive method for measuring the depth of a buried interface below the surface in a semiconductor substrate. More particularly, the non-destructive method of the present invention employs Fourier Transform Infrared (FTIR) measurements to detect the depth of a buried interface below the surface in a semiconductor substrate. The present invention non-destructively measures the depth at which the top surface of the buried interface is located. The present invention is also concerned with devices for measuring the depth of a buried interface.

BACKGROUND OF INVENTION

High processing speed in currently available data processors must be supported by large amounts of high speed random access memory. Due to reduced device counts per memory cell, much of the required storage is provided by dynamic random access memories (DRAMs) so that a significantly greater number of memory cells can be provided on a single integrated circuit chip. In such devices, the density at which memory cells, principally comprising one storage capacitor per memory cell, is of great importance since the capacitance of each capacitor is very limited due to small size, while that capacitance must be large compared to the capacitance of the word line and bit line to achieve adequate operating margins for the sense amplifiers used to detect the presence or absence of stored charge. Therefore, the trenches are formed to relatively large depths while being very closely spaced. These same geometries are also important for other trench structures such as isolation trenches.

In recent years, it has also been the practice to provide a buried plate within the semiconductor substrate in which the trench capacitors are formed. The buried plate is a region surrounding the sides and bottom of a storage node trench in the dynamic random access memory cell which acts as the fixed potential terminal for the storage capacitor. The buried plate typically goes down the sides of the storage node trench about 6 microns. The depth at which the top surface of the buried plate is located should be a set distance such as 1.5±0.15 microns below the surface of the semiconductor substrate. This depth of the buried plate is typically referred to as $D_{BP}$.

The buried plate can be fabricated using resist recess processing along with outdiffusing of a dopant such as arsenic from the lower portion of a trench. U.S. Pat. No. 5,618,751 to Golden et al and assigned to International Business Machines Corporation describes one such process. The resist recess depth and the buried plate depth are critical parameters for the trench capacitor.

Currently, measuring the buried plate depth as well as that for other buried interface structures can only be carried out destructively by cross-section and microscopic imaging of random samples. Accordingly, providing a practical and non-destructive procedure for determining the depth at which the top surface of a buried interface is located would represent a significant advance.

SUMMARY OF INVENTION

The present invention provides a non-destructive method for measuring the depth at which the top surface of a buried interface is located in a semiconductor substrate. According to the present invention, the buried interface depth can be determined without destructively cross-sectioning. In particular, the present invention is concerned with a non-destructive method for measuring the depth of the top surface of a buried interface below the surface in a semiconductor substrate. The method of the present invention employs a Fourier Transform Infrared measurement. In particular, the method of the present invention comprises subjecting the semiconductor substrate containing the buried interface to a beam of infrared light and then detecting and analyzing the spectrum of a return signal by a Fourier analysis. The spectrum as analyzed by the Fourier analysis is then compared to calibration spectra to thereby determine the depth of the top surface of the buried interface.

The present invention is also concerned with a device for determining the depth of a buried interface below the surface of a semiconductor substrate. The device comprises a FTIR spectrophotometer which illuminates the substrate with a source of infrared radiation and which produces a Fourier transform of a return signal reflected from the substrate. The device also includes a library of stored calibration spectra, along with means for comparing the Fourier transform return signal to the calibration spectra to determine the depth of the buried interface.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
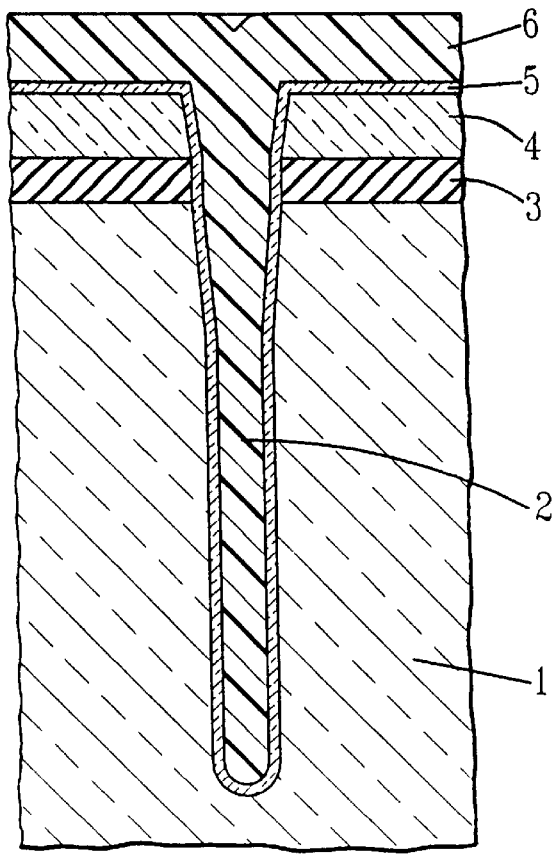
FIGS. 1–4 are schematic diagrams illustrating a prior art process for providing a buried interface.

Referring now to the drawings, and more particularly FIGS. 1–4, a typical procedure for providing a buried interface, and especially a buried conductive plate is illustrated for purposes of background. For purposes of simplicity and to further facilitate an understanding of the present invention, the following discussion is directed to a buried conductive plate as the buried interface, it being understood, of course, that the present invention is applicable for measuring the depth of other buried interface structures marking the line between regions of significantly different dopants or between regions of significantly different doping concentrations. An example of one such buried interface in addition to a buried conductive plate is a subsurface doped region of silicon which forms a source/drain terminal or gate terminal of a vertical FET transistor within a trench. In memory arrays which have such vertical transistors, the present invention could be used to determine the depth of such buried doped regions.

Figure 2:
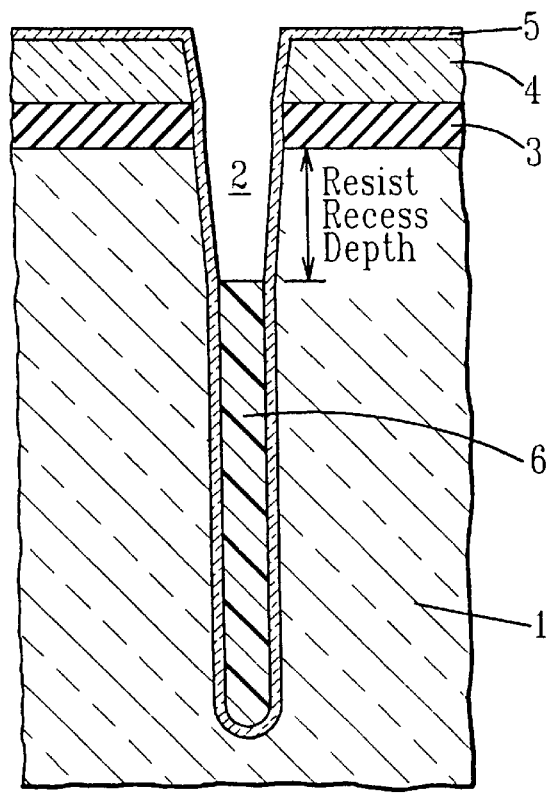
Figure 3:
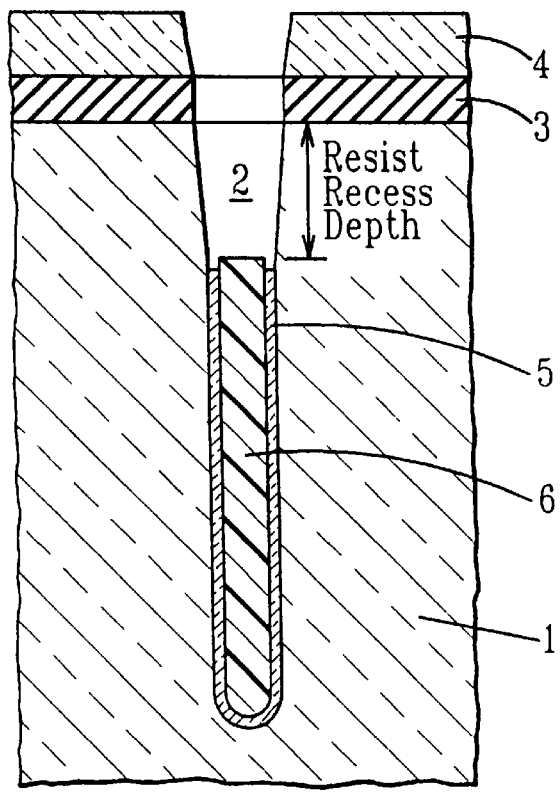
Figure 4:
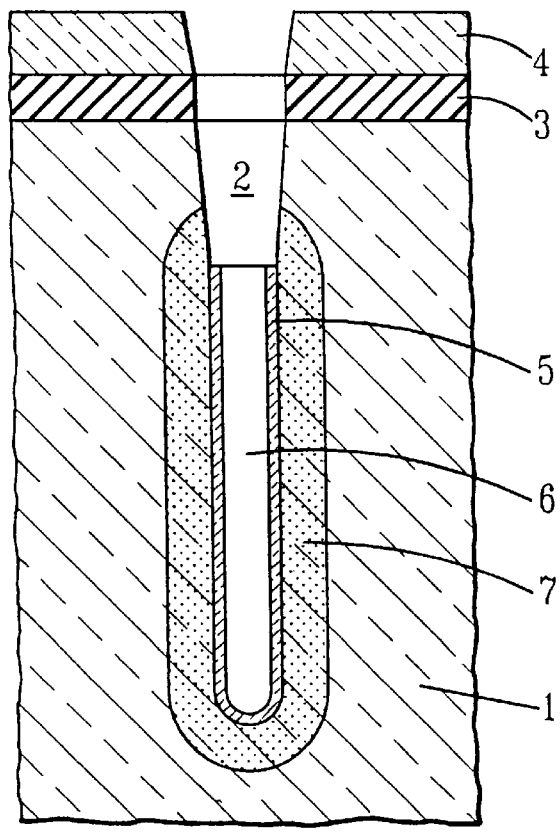

FIG. 1 illustrates a semiconductor substrate 1 such as silicon containing a trench 2. Numeral 3 represents a thin silicon nitride pad covered by a relatively thick layer 4 of tetraethylorthosilicate (TEOS). Numeral 5 represents a layer of arsenic doped silicate glass (ASG) deposited within trench 2. A photoresist 6 is provided above and within trench 2. The photoresist can be a positive photoresist such as those based upon novolak resins. As illustrated in FIG. 2, the photoresist 6 is recessed to about 1.5 microns below the substrate surface by exposure and development or dry etching. The layer 5 (ASG) is etched back in accordance with the resist recess 6 such as using a buffered hydrofluoric acid (BHF). The layer 5 is typically etched slightly below the resist recess (see FIG. 3). The remaining resist fill 6 in the trenches is then removed and then impurity diffusion or drive-in from the ASG into the substrate 1 or p-well therein is then carried out to substantially form the buried plate 7 in accordance with the location of the remaining ASG. Typical times and temperatures for the drive-in are 3 hours at 1050° C. or 1 hour at 1100° C.

Figure 5:
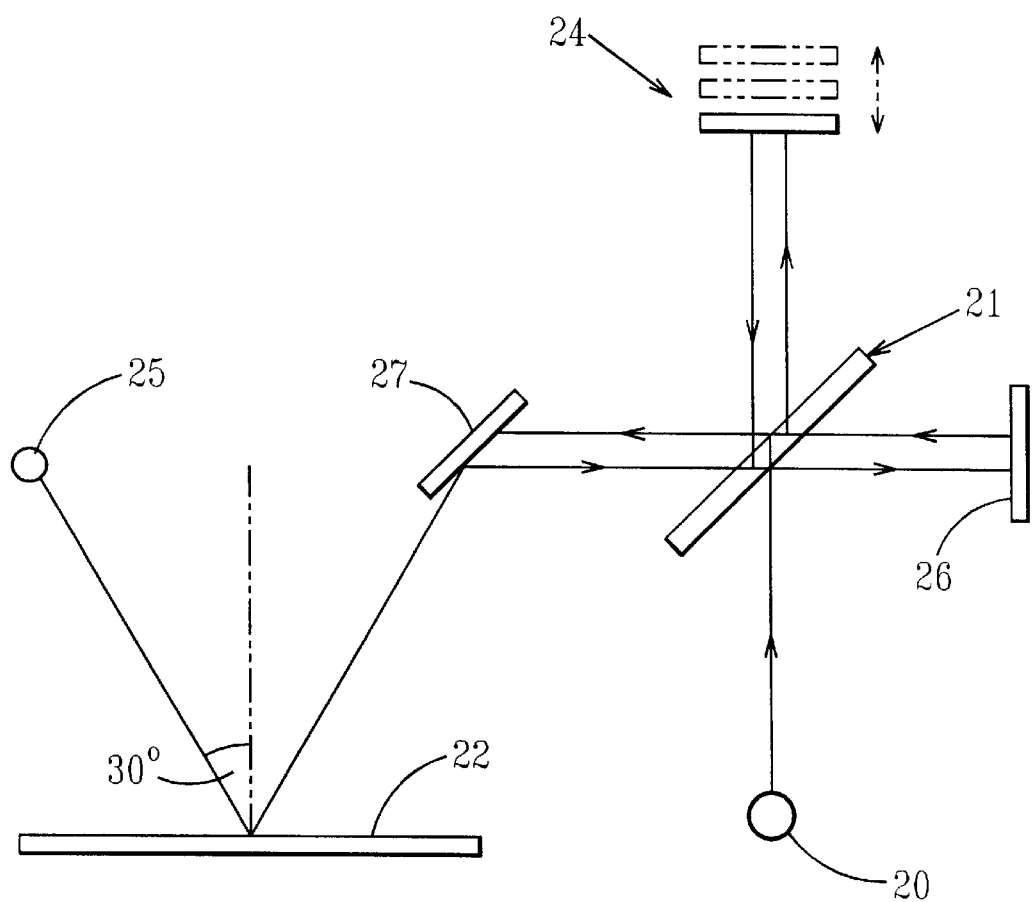
FIG. 5 is a schematic diagram of the arrangement employed to carry out the FTIR measurements according to the present invention.

Samples with different DBP were prepared and exposed to an infrared beam of a FTIR system. A typical FTIR system is available from Bio-Rad Laboratories under the trade designation Bio-Rad QS500. FIG. 5 illustrates a schematic of the FTIR set up. In particular, a FTIR system is an instrument which emits a controlled infrared spectrum and detects and analyzes the spectral content of a return signal by Fourier analysis. As illustrated in FIG. 5, an IR source 20 is provided such as a Globar IR source to emit broadband infrared energy for instance at wave numbers between 400 and 4500 (a wavelength range of about 25 microns to about 2 microns). An interferometer such as a Michaelson interferometer is located in the path from the IR source 20 to sample 22. The interferometer includes moving mirror 24, fixed mirror 26 and beam splitter 21. The interferometer utilizes a moving mirror 24 to produce constructive and destructive interference patterns at detector 25. These patterns depend upon the frequency or wave number of the detected light as well as the characteristics of the sample. Mirrors 26 and 27 direct the path of the light from the source to the sample. Circuitry (not shown) is provided for performing a Fourier transform of the return signal arriving at detector 25. A detailed description of such circuitry is not necessary since persons skilled in the art, once aware of this disclosure, could provide such without undue experimentation.

In the case of arsenic as the dopant for creating the buried plate, it has been found according to the present invention that the portion of the spectrum between 400 and 1500 wave numbers shows a specific absorption band which is deemed to be attributed to a vibration of the As-O bond. This absorption band is characterized by two absorption peaks, one around 1020 wave numbers and another between 700 and 800 wave numbers. The pattern of this absorption band and the ratio of the heights of these two peaks is changed significantly with increasing $D_{BP}$. In fact, it has been found according to the present invention that each $D_{BP}$ depth causes a very distinct pattern in this portion of the spectrum which is used according to the present invention for measuring the buried plate depth non-destructively by means of pattern comparison.

In particular, the spectral content of the return signal for several samples of known buried plate depth are analyzed to create a body or library of reference or calibration spectra. If desired, the library can include different sets of calibration spectra, for example, a set for each DRAM generation, such that in use, the device would be comparing the return signal only to the proper set of spectra that match the characteristics of the wafer being tested. The known buried plate depth of analyzed samples is determined by cross-section highlighted or contrast etching of the outdiffused area and scanning electron microscope (SEM) measurement. According to the present invention, the unknown sample is illuminated with the IR light and the spectral content of the return signal is analyzed to determine which of the reference or calibration spectra the unknown spectrum most closely matches. The reference spectrum which most closely matches the unknown spectrum indicates the depth of the top of the buried plate.

According to preferred aspects of the present invention, for maximizing the comparison, the calibration spectra is truncated at 440 cm$^{-1}$ and at 1180 cm$^{-1}$ and the intensity of the values is normalized between 0 and 1. Likewise, the spectra from the unknown sample whose $D_{BP}$ needs to be determined is also truncated at 440 cm$^{-1}$ and at 1180 cm$^{-1}$ and intensity normalized to values between 0 and 1.

The process of finding the matching known spectrum can be performed by a least squares comparison of the unknown spectrum to some or all of the known spectra. For example, SUM i=1 to i=n of corresponding points $(a_i-b_i)^2$ along each curve is used to find the minimum sum. In other words, the least square fit procedure involves calculating the difference for each wave number and each calibration spectrum; squaring the difference for each wave number and each calibration spectrum; summing up the squares for all wave numbers and each calibration spectrum; and determining the minimum of all sums. The minimum is found for the best fitting calibration spectrum and the $D_{BP}$ of the sample is the same as the one of the calibration spectrum. Of course, other correlation methods can be used if desired such as by calculating the covariance "COV" or the Correlation Coefficient $\rho_{xy}$ as described in Users' Guide Microsoft® Excel.

The Covariance tool returns the average of the product of deviations of data points from their respective means. Covariance is a measure of the relationship between two ranges of data.

$$\text{cov}(X, Y) = \frac{1}{n} \sum (x_i - \mu_x)(y_i - \mu_y)$$

wherein $\mu_x$ is the mean value of x-data set and $\mu_y$ is the mean value of y-data set.

The Correlation tool measures the relationship between two data sets that are scaled to be independent of the unit of measure. The population correlation calculation returns the covariance of two data sets divided by the product of their standard deviations.

$$\rho_{x,y} = \frac{\text{cov}(X, Y)}{\sigma_x \cdot \sigma_y}$$

where $\sigma_y$ is standard deviation of y-data set;
where $\sigma_x$ is standard deviation of x-data set; where $$\sigma_x^2 = \frac{1}{n} \sum (X_1 - \mu_x)^2$$

and $$\sigma_y^2 = \frac{1}{n} \sum (Y_1 - \mu_y)^2$$

Figure 6:
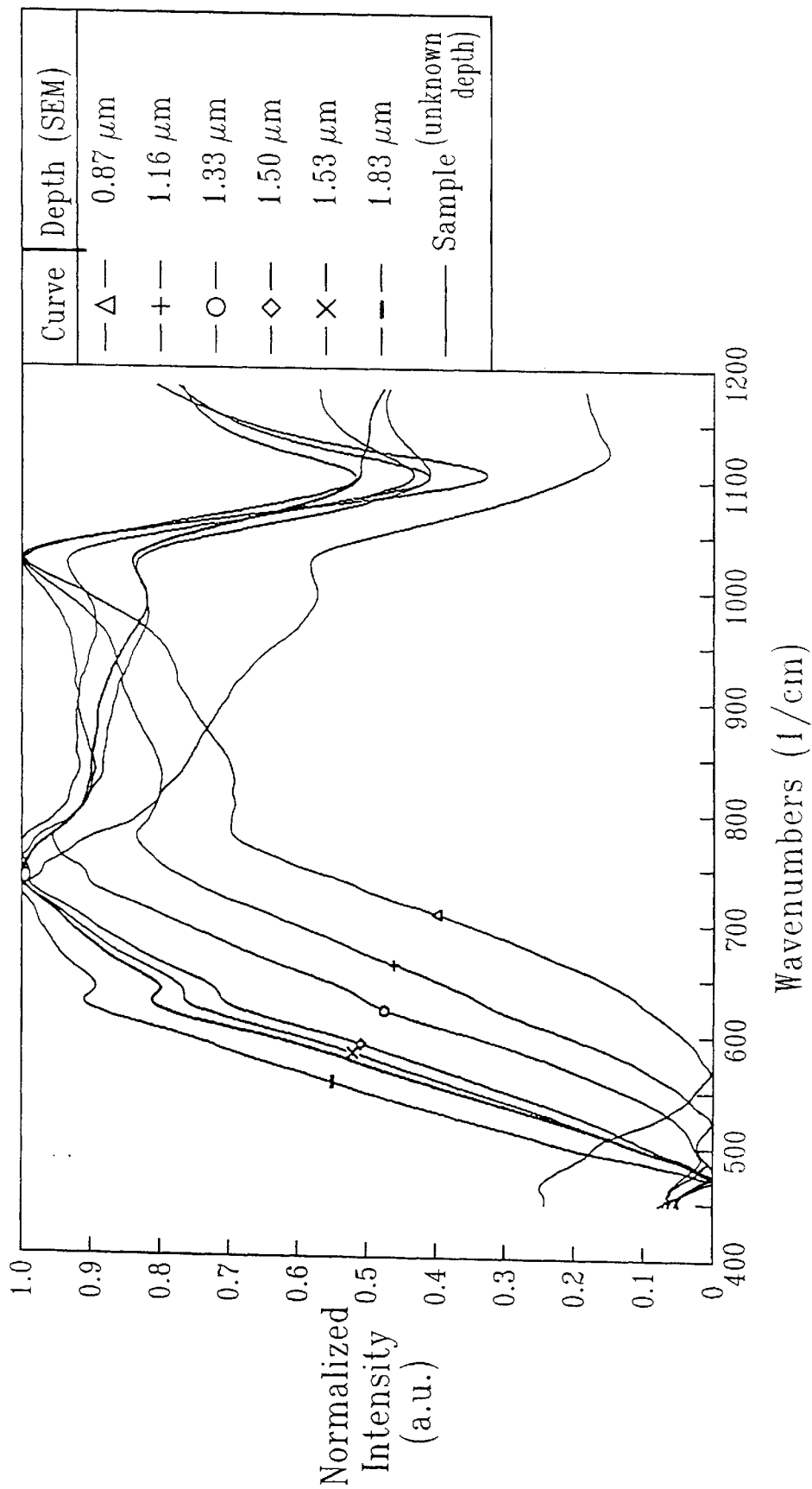
FIG. 6 provides curves showing the spectral content of known and unknown samples having different buried plate depth measurements.

FIG. 6 contains curves showing the spectral content of known and unknown samples having different buried plate depth measurements. FIG. 6 is the plot after being normalized in intensity and ready for comparison such as by the least squares method to the unknown sample which appears on the plot. The unknown sample in FIG. 6 fits most closely to the curve representing a depth of 1.53 μm. Also, it should be understood that increasing the number of correlation curves increases the accuracy of the measurement.

Figure 7:
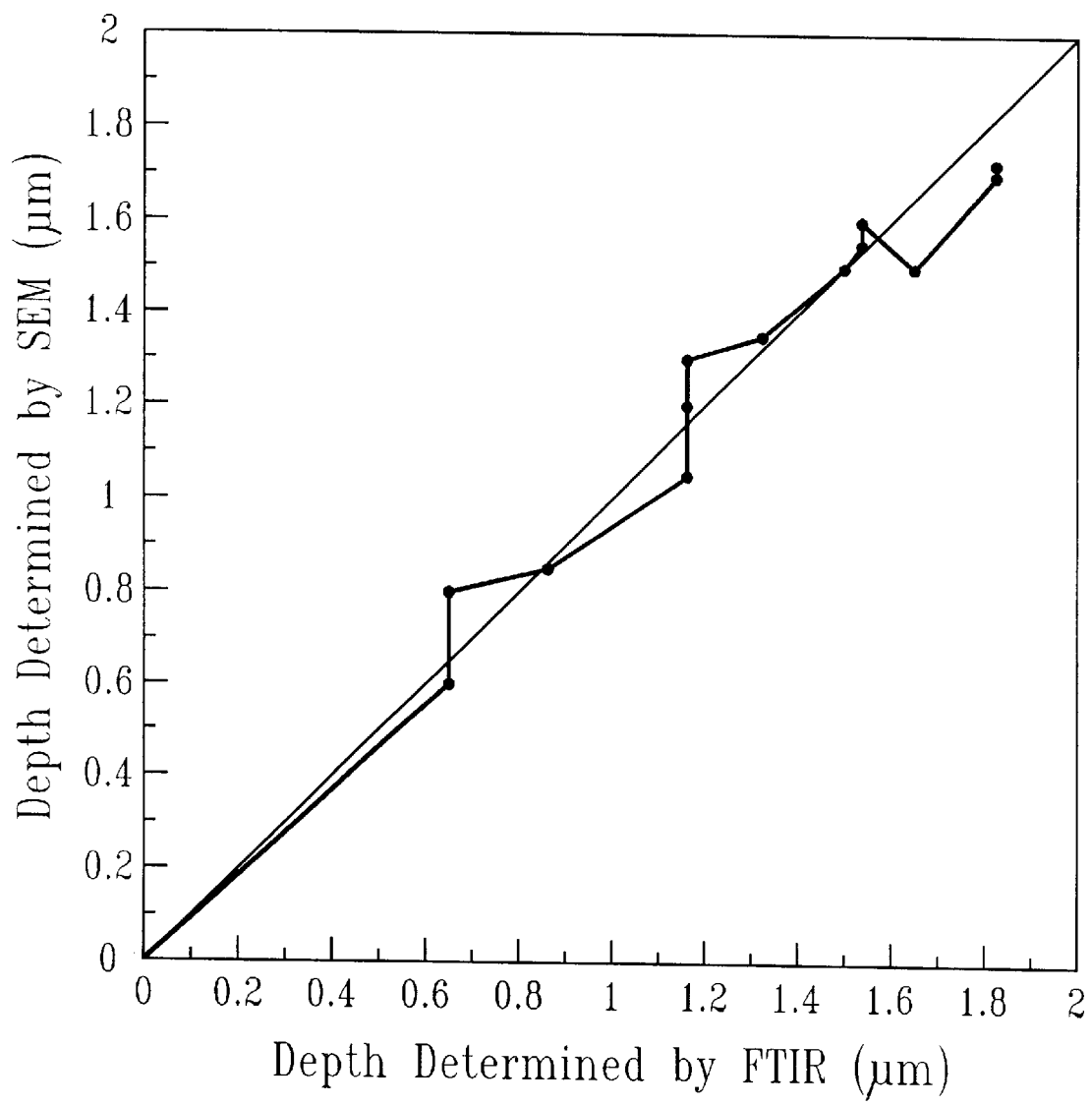
FIG. 7 is a graph that confirms the measurements obtained by the present invention compared to SEM cross-sectioning.

FIG. 7 is a graph confirming the depth measures obtained by the present invention by SEM cross-sectioning. Values on the x-axis are from FTIR. Values on the y-axis are from SEM.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A non-destructive method for measuring the depth of the top of a buried interface below the surface in a semiconductor substrate, wherein said buried interface is a buried arsenic conductive plate, which comprises illuminating the semiconductor substrate containing the buried interface to be measured with infrared light; detecting and analyzing the spectral content of a return signal by Fourier analysis; and comparing the spectral content of said return signal to calibration spectra to thereby determine the depth of said buried interface, and wherein absorption bands of said calibration spectra at about 1020 wave numbers and between 700 and 800 wave number have absorption peaks.

2. The method of claim 1 wherein said infrared light is broadband IR radiation.

3. The method of claim 2 wherein the wavelength of said IR radiation is 2–25 microns.

4. The method of claim 1 wherein the depth of the top of said buried conductive plate is about 1.5±0.15 microns below the surface of the semiconductor substrate.

5. The method of claim 1 wherein said comparing employs a least squares comparison of the spectra from the sample compared to the calibration spectra.

6. The method of claim 1 wherein the intensity of the values is normalized between 0 and 1 prior to the comparing.

\* \* \* \* \*

UNITED STATES PATENT AND TRADEMARK OFFICE
CERTIFICATE OF CORRECTION

PATENT NO. : 6,124,141
DATED : September 26, 2000
INVENTOR(S) : K. Paul MULLER; Venkatachalam C. JAIPRAKASH It is certified that error appears in the above-indentified patent and that said Letters Patent is hereby corrected as shown below:

Column 3, line 25, replace "DBP" with --$D_{BP}$--.

Signed and Sealed this

Fifteenth Day of May, 2001

Attest:

NICHOLAS P. GODICI

Attesting Officer     Acting Director of the United States Patent and Trademark Office